United States Patent [19]

Hinton

[11] Patent Number: 4,546,317

[45] Date of Patent: Oct. 8, 1985

[54] FREE NUCLEAR PRECESSION GRADIOMETER SYSTEM

[75] Inventor: George F. Hinton, Bay St. Louis, Miss.

[73] Assignee: The United States of America as represented by the Secretary of the Navy, Washington, D.C.

[21] Appl. No.: 510,131

[22] Filed: Jul. 1, 1983

[51] Int. Cl.$^4$ ............................................. G01R 33/00
[52] U.S. Cl. .................................................... 324/301
[58] Field of Search ................. 324/301, 304, 305, 315

[56] References Cited

U.S. PATENT DOCUMENTS

| | | | |
|---|---|---|---|
| 3,249,856 | 5/1966 | Lemaire | 324/301 |
| 3,373,650 | 3/1968 | Killpatrick | 324/301 |
| 3,495,160 | 2/1970 | Raffini | 324/301 |
| 3,525,928 | 8/1970 | Nagao | 324/315 |
| 3,577,068 | 5/1971 | La Force | 324/301 |
| 3,750,008 | 7/1973 | Asano | 324/301 |
| 3,886,440 | 5/1975 | Berry | 324/301 |
| 4,114,087 | 9/1978 | Fry | 324/301 |
| 4,418,316 | 11/1983 | Young | 324/309 |

Primary Examiner—Michael J. Tokar
Assistant Examiner—R. Raevis
Attorney, Agent, or Firm—R. F. Beers; H. A. David

[57] ABSTRACT

A free nuclear precession gradiometer uses a fluid sample surrounded by a coil the fluid sample containing one or more nuclear species which display a magnetic moment. Current in the coil polarizes the nucleii, which when the current is abruptly terminated precess coherently about the earth's magnetic field. The exact frequency generated is a precise measure of the absolute value of the earth's magnetic field. The signal is in the form of a damped sinusoid with the rate of decay being a function of gradients in the ambient magnetic field. Two vector magnetometers are mounted rigidly on the sensor at the right angles to each other and to the earth's magnetic field. A servo system continuously orients the sensor in a two-axis gimbal system to reduce the output of the vector magnetometers to zero. The instrument is polarized, a counter is triggered to make the frequency measurement, and the signal is analyzed by determining the average amplitude of the signal over a precise interval of time. The result is simultaneous measurement of total intensity and total gradient.

5 Claims, 1 Drawing Figure

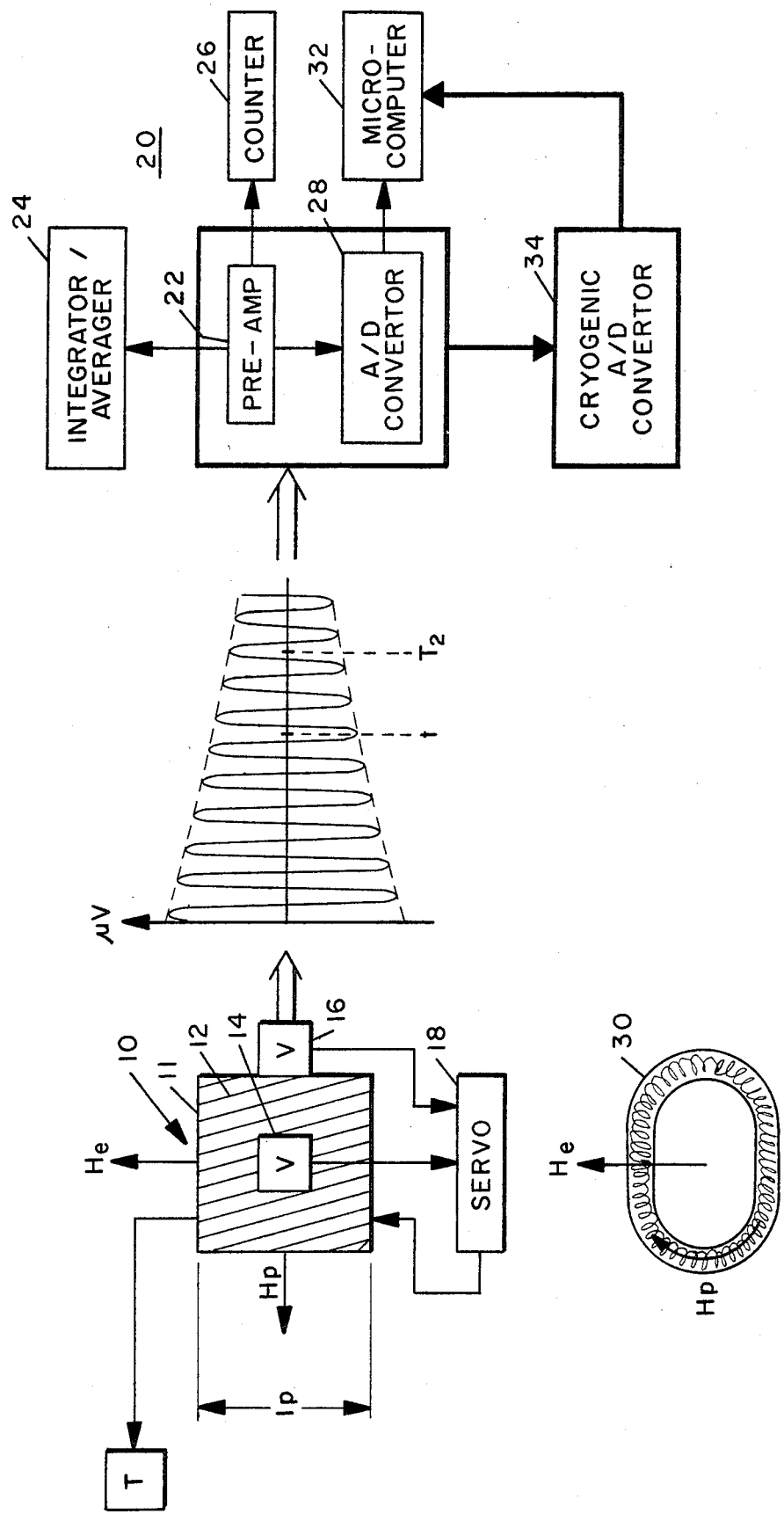

FREE NUCLEAR PRECESSION GRADIOMETER SYSTEM

BACKGROUND OF THE INVENTION

1. Field of the Invention

The present invention relates to gradiometers, and more particularly to a free nuclear precession gradiometer for measuring the gradient of the total magnetic field of the earth by continuously analyzing the shape or, equivalently, the transverse time constant of the decaying precession signal.

2. Description of the Prior Art

Proton precession magnetometers have been in use since 1956. However, since the operarion of the instrument is discontinuous, the rotation of the instrument creates noise as do the ambient magnetic gradients. Thus the use of this instrument for high sensitivity applications generally has been superceded by the use of optically pumped helium or cesium magnetometers. Nevertheless, the line width of nuclear magnetometers is much less than the line width of optically pumped magnetometers. Therefore the potential sensitivity of the nuclear magnetometers is much greater if the rotation, continuity and orientation problems can be solved.

Some experimental uses of the proton nuclear magnetometer precession decay envelope to measure magnetic total field gradients in order to practice adjusting the degaussing coils of a ship were carried out in 1960. However, the sensitivities were orders of magnitude less than the 0.00003 gamma ($\eta$T) per centimeter required for geophysical and marine surveys. The time constants for water are on the order of 2.8 seconds, requiring polarization every few seconds. Therefore, what is desired is a free nuclear precession gradiometer having a long decay time or virtually continuous operation with high sensitivity.

SUMMARY OF THE INVENTION

Accordingly, the present invention provides a free nuclear precession gradiometer using a fluid sample surrounded by a coil, the fluid sample containing nuclear species which display a magnetic moment. Current in the coil polarizes the nucleii, which when the current is abruptly terminated precess coherently about the earth's magnetic field. The exact frequency generated is a precise measure of the absolute value of the earth's magnetic field. The signal is in the form of a damped sinusoid with the rate of decay being a function of gradients in the ambient magnetic field. Two vector magnetometers are mounted rigidly on the sensor at right angles to each other and to the earth's magnetic field. A servo system continuously orients the sensor in a two-axis gimbel system to reduce the output of the vector magnetometers to zero. The instrument is polarized, a counter is triggered to make the frequency measurement, and the signal is analyzed by determining the average amplitude of the signal over a precise interval of time. The result is simultaneous measurement of total intensity and total gradient.

Therefore, it is an object of the present invention to provide a free nuclear precession gradiometer to measure simultaneously total intensity and total gradient of the earth's magnetic field with a high degree of sensitivity.

Other objects, advantages and novel features of the present invention will be apparent from the following detailed description when read in conjunction with the appended claims and attached drawing.

BRIEF DESCRIPTION OF THE DRAWING

The FIGURE is a block diagram of a free nuclear precession gradiometer according to the present invention.

DESCRIPTION OF THE PREFERRED EMBODIMENT

Referring to the FIGURE a magnetometer sensor 10 is basically a sample of a fluid surrounded by a coil 12, the fluid sample containing one or more nuclear species which display a magnetic moment. Current, $I_p$, in the coil 12 creates a field, $H_p$, in the fluid sample in a direction approximately perpendicular to the earth's magnetic field, $H_3$. To stabilize the sensor 10 with respect to the earth's magnetic field two vector magnetometers 14, 16 are mounted rigidly on the sensor at right angles to each other and to the earth's magnetic field. A servo system 18 continuously orients the sensor 10 in a two-axis gimbal mount to reduce the output of the vector magnetometers 14, 16 to zero. A flux-gate magnetometer with a frequency well separated from the nominal frequency of the magnetometer sensor 10 can provide accuracies of 1 arcminute orientation error. The servo system 18 is as non-magnetic as possible, preferably of the hydraulic or pneumatic type. A power supply stable to one part in 10,000 or better is used to provide a 100 Gauss applied field for each successive measurement, and the time duration of the polarizing cycle is precisely repeated.

The output of the magnetometer sensor 10 is a sinusoidal decay signal for which the amplitude relation is $V(t) = V_o e - t/T_2$ where $V_o$ is the initial amplitude, $V(t)$ is the amplitude after time t, and $T_2$ is the transverse relaxation time so that when $t = T_2$ the amplitude has decayed to 1/e of its initial value. The output is input to an analysis circuit 20 to determine the average amplitude or decay characteristics over a precise interval of time. One path of analysis is to send the signal through a pre-amplifier 22 and then to a voltage integrator or averager 24 to determine the average amplitude of the signal over the same precise interval of time that a counter 26 is determining average frequency. Another path is to send the signal from the pre-amplifier 22 to an analog-to-digital (A/D) convertor 28 and then to a microcomputer 32. The microcomputer 32 can compute the amplitude average or, preferably, calculate precise realtime Fourier Transforms of the signal, thus separating the frequency measurement from the relaxation time measurement of $T_2$. The pre-amplifier 22 and A/D converter 28 may be replaced by a cryogenic converter 34 to directly encode the signal as a set of high resolution digital numbers for direct input to the microcomputer 32.

A temperature control system, T, is also included since the transverse relaxation time is a function of viscosity of the fluid sample which is in turn a function of temperature. The temperature control system, T, maintains the sensor 10 at a constant temperature and is not magnetic. Alternatively, the temperature control system, T, may sense any temperature variations of the fluid sample and apply a correction factor in the microprocessor 32. Oxygen-free low viscosity hydrocarbons may be used for the fluid sample to give a continuous measurement time of up to a minute which provides the ability, with two or more devices alternately cycling, for continuous measurements.

In operation the coil 12 is wrapped around a cylindrical or cubical container 11 containing a hydrogen-rich fluid, such as kerosene which provides protons as the nuclear specie. The container 11 is of a non-magnetic, non-conductive material. The current, $I_p$, is applied for a short period of time, creating a magnetic field in the fluid of perhaps 100 Gauss which is transverse to the earth's magnetic field of about ½ Gauss. The current, $I_p$, is turned off, collapsing the polarizing field, $H_p$, abruptly and leaving a large number of protons aligned transverse to the earth's magnetic field, $H_e$, and precessing coherently about it at about 2000 Hz. This coherence is rapidly lost due to atomic magnetic fields, and in the absence of an external magnetic gradient the inital amplitude of the signal is reduced to 1/e of its initial value in a relaxation time, $T_2$, which is characteristic of a particular fluid at a particular temperature. In the presence of an external gradient the decay is more rapid and a change in this decay rate is a measure of the change in the external gradient. Note that the sensor 10 is stablized with $H_e$ in the plane of the coil windings 12 by the two vector magnetometers 14, 16 driving the servo system 18, and the temperature of the fluid is stabilized and/or corrected by the temperature stabilization system T. The decaying signal, $V(t)$, is sent to the pre-amplifier 22 and then sent simultaneously to the counter 26 and the integrator/averager 24, or alternatively to the A/D converter 28 and the microcomputer 32, for computation of the total field and total gradient.

The open single coil 12 construction indicated is susceptible to external ac noise sources. Also, the vector stabilization magnetometers 14, 16 are also effected by $H_p$ during the polarizing part of the cycle. A toroidal noise-canceling coil 30 is very insensitive to external ac sources. The earth's magnetic field $H_e$, is still constrained to be in the plane of the windings of the coil 10 by the same means as the open, single coil 12. $H_p$ is trapped within the torus and has no external effects.

If necessary the sensor 10 can be further stabilized in rotation about an axis parallel to $H_e$ by a rate gyro, such as a laser-ring gyro, affixed to the sensor 10. The output of the gyro is used either to drive a servo to nullify rotation, or to apply a correction to the data since the effect of the rotation on the precession signal is readily calculable. A fluid sample using two or more nuclear species may also be used to compensate for rotation or orientation errors by taking frequency and amplitude differences between the species. As an example experiments have been done with a fluorine solution in water, so a fluid sample could have protons (hydrogen nuclei) and fluorine nuclei.

Use of the long decay rate hydrocarbons permits a lock-on amplifier to be inserted for the pre-amplifier 22 for high sensitivity applications. The lock-on time is amply compensated for by the long decay rate. Such a system may be used in a magnetic anomaly detector for geophysical surveying or for detection of underwater vessels.

The above described qradiometer is of the intermittent type requiring regular dc polarizing pulses. For continuous operation a magnetometer using the Overhauser effect may be used for the sensor 10. This requires a continuous RF saturation of electron spin resonance lines. The fluid requires the incorporation of special free radicals. However, these free radicals in the past have had a limited lifetime. Recent advances in free radical research have developed a long life-time Overhauser effect magnetometer with continuous operation and concurrent polarization and reading. Such a magnetometer has no decay rate due to the continuous polarization, but the amplitude of the precession signal is a function of the changes in the ambient magnetic gradient.

Thus, the present invention provides a gradiometer which is stabilized with respect to the earth's magnetic field and which monitors the amplitude variation of the precession signal to determine total field gradient while simultaneously determining the precession frequency for total field intensity, resulting in a single instrument which reduces the gradient measurement to essentially a point, approaching the mathematical ideal.

What is claimed is:

1. A gradiometer comprising:
  a nuclear precession magnetometer sensor having a fluid sample containing nuclear species which display a magnetic moment, said sample comprising a low viscosity, high molecular weight hydrocarbon which includes protons as the nuclear specie;
  means for stabilizing said magnetometer sensor with respect to the earth's magnetic field to reduce noise due to rotation and orientation, said means for stabilizing comprising a pair of vector magnetometers mounted rigidly on said magnetometer sensor orthogonal to each other and to the earth's magnetic field, and a servo system connected to said magnetometer sensor via a two-gimbal mount which continuously orients said magnetometer sensor to reduce the output of said pair of vector magnetometers to zero;
  means for polarizing said fluid sample to produce a polarization field essentially transverse to the earth's magnetic field;
  measuring means for measuring the frequency of an output precession signal from said magnetometer sensor over a precise time interval to determine the total field intensity of the earth's magnetic field, and for monitoring the amplitude variations of said output precession signal over said precise time interval to determine the total field gradient of the earth's magnetic field at essentially a point;
  said measuring means comprising a frequency counter to determine the average frequency of said output precession signal over said precise time interval, said average frequency being a measure of said total field intensity, and an integrator to determine the average amplitude of said output precession signal over said precise time interval, said average amplitude being a measure of the total field gradient;
  said measuring means further comprising a lock-on amplifier to lock onto said output precession signal, an analog to digital converter connected to receive its input from said lock-on amplifier and operable to convert said output precession signal to a computer compatible format, and a microcomputer operable to calculate from said computer compatible format a precise realtime Fourier Transform for said output precession signal from which said average frequency and said average amplitude over said precise time interval are determined;
  a temperature control system connected to said magnetometer sensor so as to maintain said fluid sample at a constant temperature and to sense any temperature variations so that a correction factor is determined for said output precession signal; and a toroidal noise-cancelling coil disposed to trap said polarization field within said coil while constraining the earth's magnetic field to the plane of the windings of said coil such that said magnetometer sensor and said stabilizing means are protected from external ac noise.

2. A gradiometer as recited in claim 1 wherein said stabilizing means further comprises a rate gyro affixed to said sensor to drive a servo to nullify rotation and to sense residual rotation to apply a correction factor to said output precession signal.

3. A gradiometer as recited in claim 2 wherein said polarizing means comprises a pulsed, stable dc power supply having a precise, repeatable time duration for the polarizing cycle.

4. A gradiometer as recited in claim 3 wherein said fluid sample comprises a solution of hydrogen nuclei and fluorine nuclei.

5. A gradiometer as recited in claim 4 wherein said stabilizing means further comprises means for detecting the frequency and amplitude differences between said nuclear species to provide a correction factor for said precession signal due to rotational and orientation errors.

* * * * *